United States Patent [19]

Sugimori et al.

[11] Patent Number: 4,713,813
[45] Date of Patent: Dec. 15, 1987

[54] LOGIC ANALYZER

[75] Inventors: Masayasu Sugimori; Mitsuhiro Morishita, both of Tokyo, Japan

[73] Assignee: Ando Electric Co., Ltd., Tokyo, Japan

[21] Appl. No.: 878,101

[22] Filed: Jun. 25, 1986

[30] Foreign Application Priority Data

Jul. 3, 1985 [JP] Japan .................... 60-146190

[51] Int. Cl.⁴ .................... G01R 31/28; G09G 1/08
[52] U.S. Cl. .................... 371/15; 324/73 R; 364/900
[58] Field of Search .................... 371/15, 20, 29; 324/73 R, 73 AT; 364/550, 551, 481, 900

[56] References Cited

U.S. PATENT DOCUMENTS

| 4,364,036 | 12/1982 | Shimizu | 364/900 X |
| 4,375,635 | 3/1983 | Leow et al. | 371/25 X |
| 4,425,643 | 1/1984 | Chapman et al. | 371/20 |
| 4,560,981 | 12/1985 | Jackson et al. | 340/747 |
| 4,574,354 | 3/1986 | Mihalik et al. | 364/481 |
| 4,585,975 | 4/1986 | Wimmer | 364/580 X |

Primary Examiner—Charles E. Atkinson
Attorney, Agent, or Firm—Panitch Schwarze Jacobs and Nadel

[57] ABSTRACT

A logic analyzer including at least a sampling system for sampling input data with a sampling clock signal comprises a condition decision circuit having inputs supplied with the input data and an internal clock signal for producing a conditioning signal in dependence on the input data in synchronism with the internal clock signal, a clock detection circuit for deciding whether the sampling clock signal makes appearance within a predetermined period of the internal clock signal to produce a signal representative of the result of the decision, and a control circuit having inputs supplied with the conditioning signal and the signal representative of said result for producing a trigger signal corresponding to the conditioning signal in dependence on the signal representative of the result of decision.

2 Claims, 20 Drawing Figures

| ADDRESS | | | | | DATA | |
|---|---|---|---|---|---|---|
| A4 | A3 | A2 | A1 | A0 | D1 | D0 |
| 0 | 0 | 0 | 0 | 0 | 0 | 0 |
| 0 | 0 | 0 | 1 | 1 | 1 | 0 |
| 1 | 0 | 0 | 0 | 1 | 0 | 0 |
| 1 | 1 | 1 | 0 | 0 | 0 | 1 |
| 1 | 0 | 1 | 0 | 1 | 0 | 0 |
| 1 | 1 | 1 | 1 | 1 | 0 | 1 |
| 1 | 0 | 0 | 0 | 0 | 0 | 0 |
| 1 | 0 | 0 | 1 | 1 | 0 | 1 |

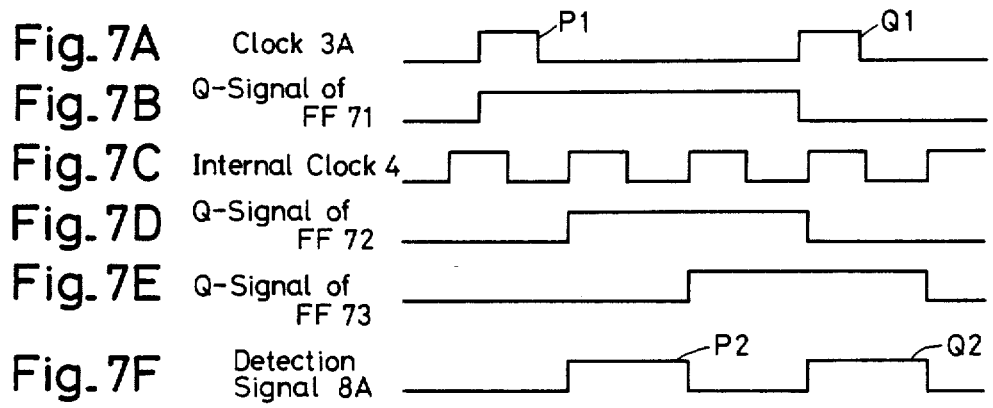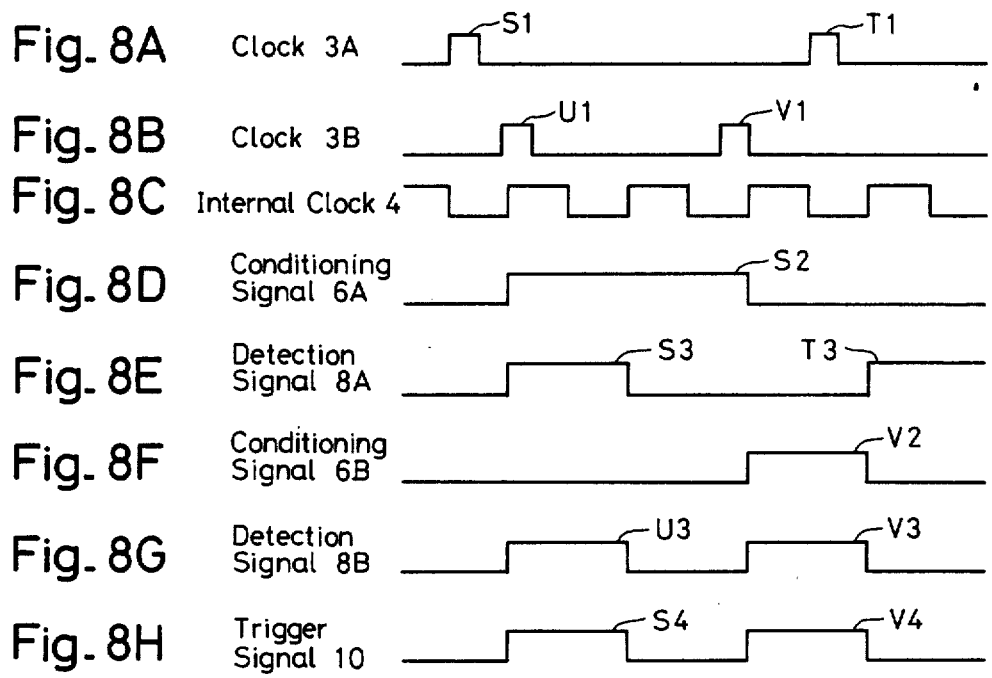

LOGIC ANALYZER

BACKGROUND OF THE INVENTION

1. Field of the Invention

The present invention generally relates to a logic analyzer and more particularly to a trigger control apparatus for a logic analyzer which incorporates therein a plurality of sampling channels.

2. Description of the Related Art

In the logic analyzer of the type mentioned above, when input data supplied to the different sampling channels are closely related to one another, there often arises such a case in which the start and stop of the sampling operation of the logic analyzer as a whole is to be controlled by combining the trigger conditions of the individual sampling channels. To this end, there has heretofore been known a so-called arming technique. According to this technique, the initiation and termination of the sampling operation are controlled individually on the channel-by-channel basis. To this end, arrangement is made such that detection of a given one of the sampling channels being riggered allows that given channel to make decision as to whether the conditions to trigger other sampling channel are met. However, the arming technique suffers disadvantages in that the tracing operation of one sampling channel can not be controlled by other sampling channel or vice versa.

SUMMARY OF THE INVENTION

It is therefore an object of the present invention to provide a trigger control apparatus for a logic analyzer in which the trigger conditions of the individual sampling channels can be determined freely in combination on the same time basis to thereby permit a sequential trigger as well as parallel trigger, whereby the tracing operation of one channnle can be controlled in dependence on the trigger condition of other sampling channel or vice versa.

Here, the meaning of the phrases "sequential trigger" and "parallel trigger" will be explained. It is assumed, for example, that the trigger condition of a first sampling channel is represented by C with the trigger condition of a second sampling channel being represented by D. The sequential trigger corresponds to the case where the conditions are so set that both the sampling channels are triggered upon occurrence of the condition C of the first sampling channel in succession to the occurrence of the condition D of the second sampling channel, while the parallel trigger means such operation in which both the sampling channels are triggered in response to the occurrence of either the condition C or D.

These and other advantages and attainments of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

FIGS. 7A to 7F are diagrams showing signal waveforms for illustrating operation of the circuit shown in FIG. 6; and FIGS. 8A to 8H are diagrams showing waveforms for illustrating operation of the apparatus shown in FIG. 2.

DESCRIPTION OF THE PREFERRED EMBODIMENTS

In the course of the following detailed description, reference will be made to the attached drawings.

Figure 1:
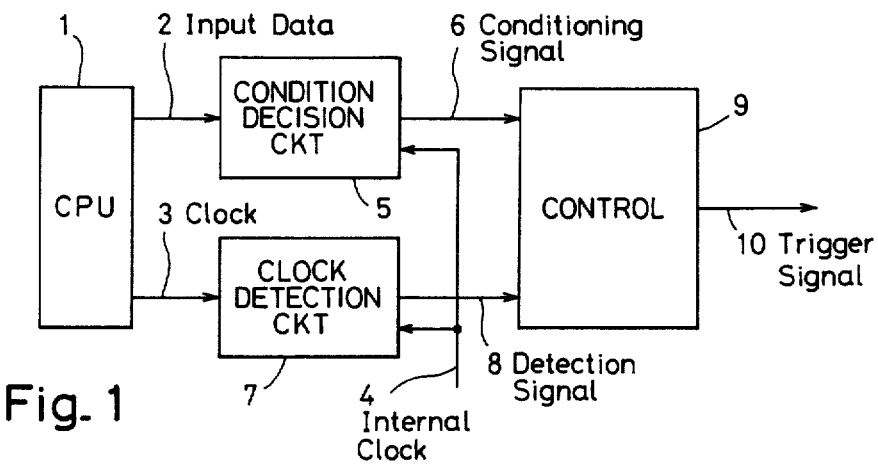
FIG. 1 is a view showing in a block diagram a general arrangement of a trigger control apparatus according to an exemplary embodiment of the present invention.

FIG. 1 shows an internal structure of a logic analyzer according to an embodiment of the invention, which includes a single sampling channel for sampling the input data.

Referring to FIG. 1, a reference numeral 1 designates a CPU of an apparatus to be tested, a numeral 2 denotes an input data signal supplied from the CPU 1, a numeral 3 denotes a clock signal, a numeral 4 denotes another clock signal generated internally of the logic analyzer, a numeral 5 denotes a condition decision circuit, a numeral 6 denotes a conditioning signal, 7 denotes a clock detection circuit, 8 denotes a clock detection signal, 9 denotes a control circuit and finally a numeral 10 denotes a trigger signal outputted from the control circuit 9.

As the clock signal 3, a sampling clock signal or a clock signal supplied from an external source may be utilized. The source of the internal clock signal 4, the condition decision circuit 5, the clock detection circuit 7 and the control circuit 9 are provided internally of the logic analyzer.

In the case of the illustrated embodiment, the CPU 1 supplies the input data 2 to the condition decision circuit 5 while supplying the clock signal 3 to the clock detection circuit 7. The internal clock signal 4 is supplied to both the condition decision circuit 5 and the clock detection circuit 7. The condition decision circuit 5 produces the conditioning signal 6 corresponding to the input data signal 2 in synchronism with the internal clock signal 4, the conditioning signal 6 being then supplied to the input of the control circuit 9. The clock detection circuit 7 determines or detects whether the clock signal 3 makes appearance during a period of the internal clock signal 4 and produces the detection signal 8 when the clock signal 3 makes appearance within a period of the internal clock signal 4, the detection signal 8 being applied to an input of the control circuit 9. Upon every appearance of both the conditioning signal 6 and the detection signal 8, the control circuit 9 produces the trigger signal 10 corresponding to the conditioning signal 6, the trigger signal 10 being supplied to an associated sampling channel for controlling the start or stop of the sampling operation of that sampling channel in synchronism with the interal clock signal 4.

Figure 2:
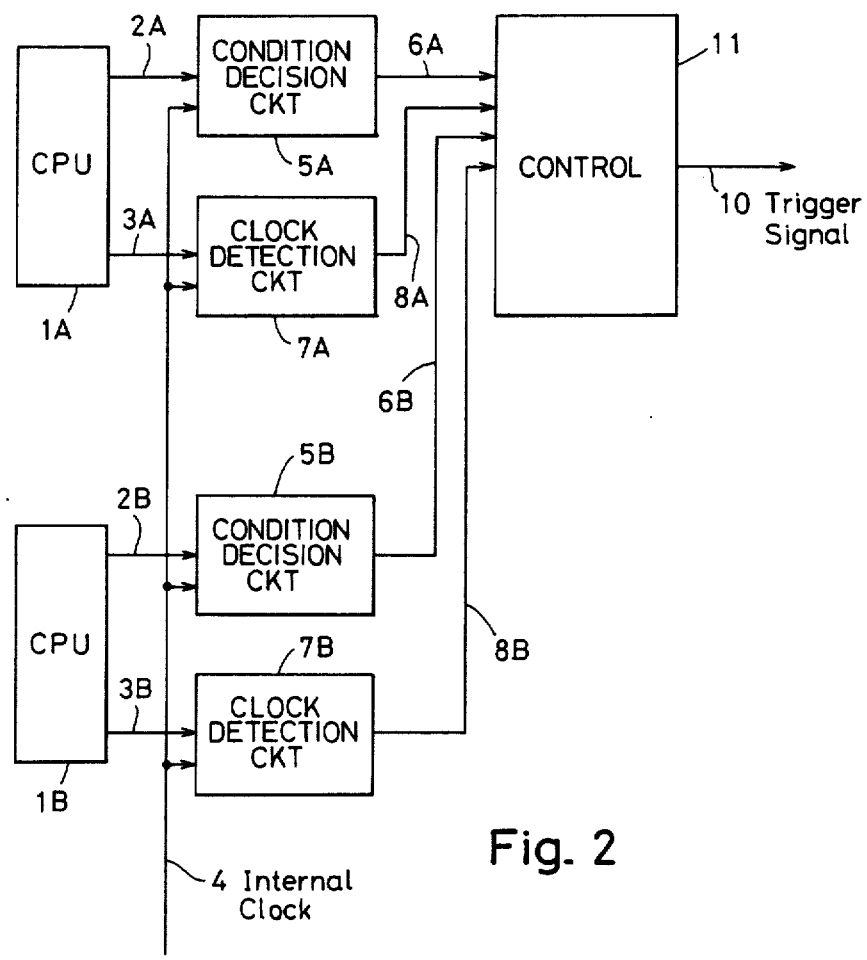
FIG. 2 is a view showing a version of the same according to another embodiment of the invention.

FIG. 2 shows a circuit arrangement of a second embodiment of the present invention. More specifically, FIG. 2 shows an internal structure of a logic analyzer including two sampling channels for sampling the input data. In the figure, reference characters 1A and 1B denote CPUs, respectively, characters 2A and 2B denote input data, characters 3A and 3B denote clock signals, 5A and 5B denote condition decision circuits, 6A and 6B denote conditioning signals, 7A and 7B denote clock detection circuits, 8A and 8B denote detection signals, respectively, a numeral 10 denotes a trigger signal and finally a numeral 11 denotes a control circuit. In conjunction with FIG. 2, it should be noted that like reference symbols are used for designating like parts as those shown in FIG. 1, repeated description of which will therefore be unnecessary. Further, it should be understood that the condition decision circuits 5A and 5B as well as the clock detection circuits 7A and 7B can be implemented in the same circuit configuration as those of the condition decision circuit 5 and the clock detection circuit 7 shown in FIG. 1, as will be described hereinafter.

In operation, the condition decision circuit 5A supplies the conditioning signal 6A to the control circuit 11 corresponding to the input data 2A, while the clock detection circuit 7A makes decision as to the appearance of the clock signal 3A in the same manner as described above, the resulting detection signal 8A being inputted to the control circuit 11. The condition decision circuit 5B and the clock detection circuit 7B supply the conditioning signal 6B and the detection signal 8B, respectively, to the control circuit 11. On the other hand, the control circuit 11 combines freely a set of the conditioning signal 6A and the detection signal 8A with a set of the conditioning signal 6B and the detection signal 8B to supply the corresponding trigger signal 10 to the two sampling channels for controlling the start and the stop of the sampling operations in the channels associated with the CPUs 1A and 1B.

Figures 3, 4:
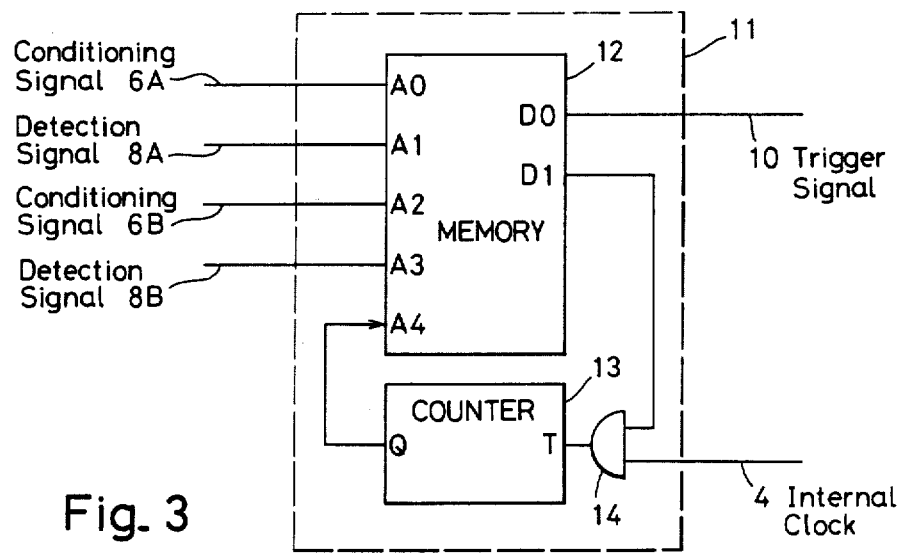
FIG. 3 is a view showing schematically a circuit configuration of a control circuit (11) shown in FIG. 2.
FIG. 4 is a view for illustrating contents of a memory (12) shown in FIG. 3.

FIG. 3 shows schematically a circuit configuration of the control circuit 11 shown in FIG. 2. It should be understood that the control circuit 9 shown in FIG. 1 may be implemented in a similar structure. Referring to FIG. 3, a reference numeral 12 denotes a memory, 13 denotes a counter and a numeral 14 denotes a gate element. In the memory 12, the symbols A0 to A4 denote address input terminals, while symbols D0 and D1 represent data output terminals. The address inputs A0 to A4 correspond to the bit positions $2^0$ to $2^4$, respectively. It should be mentioned that in the following description, the address is represented in a binary notation. By way of example, a numeral "7" is given by $(00111)_2$. The numerals within the parenthesis represent the logic states at the bit positions $2^4$ to $2^0$, respectively.

The counter 13 has a clock input terminal T and a data output terminal Q and counts the clock input in response to the leading edge thereof.

The conditioning signal 6A, the detection signal 8A, the conditioning signal 6B, the detection signal 8B shown in FIG. 2 and the output of the counter 13 shown in FIG. 3 are applied to the address input terminals A0 to A4 of the memory 12, respectively.

In the memory 12, there are stored at the address corresponding to the trigger input the logic state "1" or "0" of the trigger signal 10 shown in FIG. 2. In case the logic "1" of the data output D0 is stored at the address $(11100)_2$ of the memory 12, by way of example, the trigger signal 10 of the logic state "1" is outputted, when the conditioning signal 6B, the detection signal 8B and the output signal at the counter become logic "1". In this way, the meomory 12 supplies the trigger signal 10 to the sampling channel in dependence on the combination of the signals inputted to the control circuit 11 shown in FIG. 2.

The counter 13 counts the output of the gate 14. It is assumed that the internal clock signal 4 is utilized in the control circuit 11. Accordingly, the gate 14 has two inputs supplied with the internal clock signal 4 and the data output signal D1 of the memory 12. Every time the data output signal D1 of the memory 12 becomes logic "1", the gate 14 applies one internal clock pulse 4 to the terminal T of the counter 13. In response to the output from the gate circuit 14, the count content of the counter 13 is incremented. Consequently, even when a signal representative of the same combination as the one preceding to the incrementation of the counter 13 is inputted to the control circuit 11 shown in FIG. 2, the address of the memory 12 for this signal is set at a different location because of the output Q of the counter 13. Thus, the sequential trigger for a complicated combination of the trigger conditions is made possible.

Next, description will be made of the operation of control circuit shown in FIG. 3 on the assumption that the memory 12 stores therein the data illustrated in FIG. 4. More specifically, the data illustrated in FIG. 4 are so set in the memory 12 that the trigger signal 10 is produced when the trigger conditions are met in the sequence mentioned below:

(a) The conditioning signal 6A and the detection signal 8A become logic "1".

(b) Subsequently, the conditioning signal 6A and the detection signal 8A or alternatively the conditioning signal 6B and the detection signal 8B become logic "1".

The symbols A0 to A4 as well as D0 to D1 have the same meanings as with the case of FIG. 3. An arrow inserted in FIG. 4 indicates the sequence in which the addresses of the memory 12 are generated.

Referring to FIG. 4, since the logic "1" state of data D1 is stored at the address $(00011)_2$, the gate 14 shown in FIG. 3 supplies an internal clock pulse 4 to the counter 13 when the conditions (a) mentioned above has been met. The counter 13 counts the internal clock pulse 4 to set the output Q to "1". After the condition (a) has been met, the address A4 shown in FIG. 4 is set to "1". Since logic "1" is stored at the addresses $(11100)_2$, $(111111)_{12}$ and $(10011)_2$, the memory 12 supplies the trigger signal 10 to the associated sampling channel every time the condition (b) mentioned above is inputted.

Next, description will be made on the structure of the condition decision circuit 5A shown in FIG. 2 by referring to FIG. 5. It should be noted that the condition decision circuit 5 shown in FIG. 1 as well as the condition decision circuit 5B shown in FIG. 2 can be implemented in the same manner.

Figure 5:
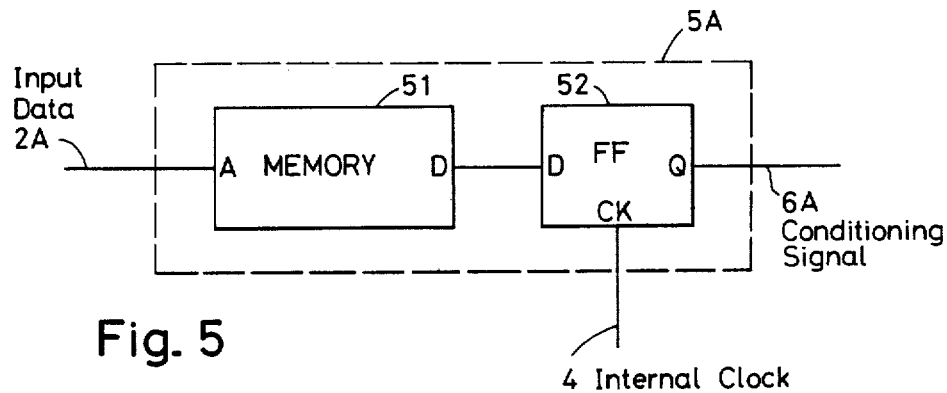
FIG. 5 is a view showing schematically a circuit configuration of a condition decision circuit (5A) shown in FIG. 2.

Referring to FIG. 5, a reference numeral 51 denotes a memory and a numeral 52 denotes a flip-flop. In response to the leading edge of the clock pulse applied to the terminal K of the flip-flop 52, the state at the terminal D is transferred to the terminal Q.

The memory 51 previously stores therein data for decision in conformance with the trigger conditions by a setting means not shown in FIG. 5. The input data 2A is applied to the address input terminal of the memory 51, whereupon the memory 51 applies the output signal corresponding to the input data 2A to the terminal D of the flip-flop 52. The terminal CK of the flip-flop 52 is supplied with the internal clock signal 4. As the consequence, the conditioning signal 6A is applied to the control circuit 11 shown in FIG. 2 in synchronism with the leading edge of the internal clock signal 4.

Figure 6:
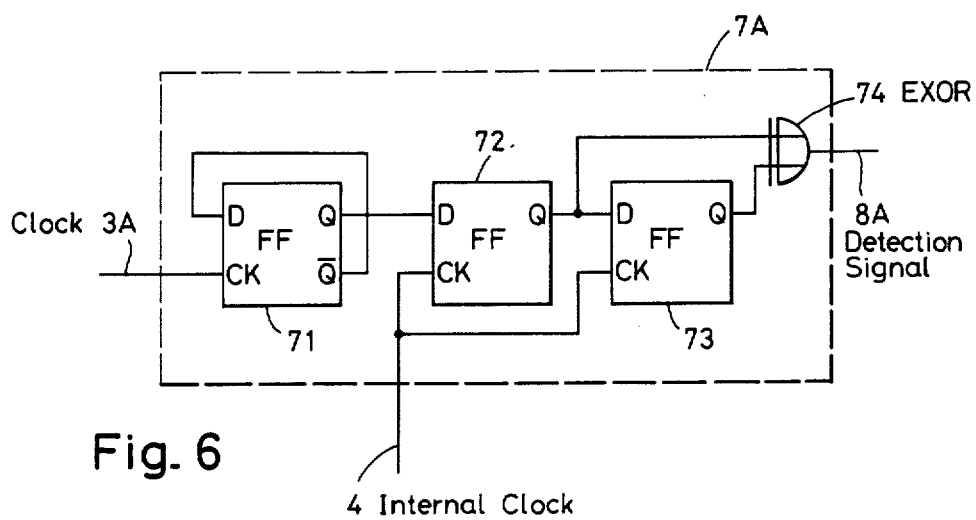
FIG. 6 is a view showing schematically a circuit configuration of a clock detection circuit (7A) shown in FIG. 2.

FIG. 6 shows a circuit configuration of the clock detection circuit 7A. It should be understood that the clock detection circuit 7 shown in FIG. 1 as well as the clock detection circuit 7B shown in FIG. 2 is realized in the similar configuration.

Referring to FIG. 6, reference numerals 71 to 73 denote flip-flops and a numeral 74 denotes an Exclusive-OR. The clock detection circuit 7A includes the flip-flops 71 to 73 and the Exclusive-OR 74. Parenthetically, the flip-flop 71 to 73 are each of the same structure as the flip-flop 52 shown in FIG. 5.

Operation of the circuit shown in FIG. 6 will be described by referring to waveforms illustrated in FIGS. 7A to 7F.

FIG. 7A shows a waveform of the clock signal 3A having pulses P1 and Q1. This clock signal 3A is applied to the terminal CK of the flip-flop 71 shown in FIG. 6. Since the flip-flop 71 is so arranged that the output thereof is inverted in response to every application of the clock pulse 3A, the waveform of the signal appearing at the terminal Q of the flip-flop 71 is such as shown in FIG. 7B. The waveform shown in FIG. 7B is applied to the terminal D of the flip-flop 72. Since the terminal CK of the flip-flop 72 is supplied with the internal clock signal 4 of the waveform shown in FIG. 7C, the waveform of the signal appearing at the terminal Q of the flip-flop 72 is such as illustrated in FIG. 7D. This waveform (7D) is applied to the terminal D of the flip-flop 73 and at the same time supplied to the Exclusive-OR 74. Since the internal clock signal 4 of the waveform shown in FIG. 7C is applied to the terminal CK of the flip-flop 73, the signal produced at the terminal Q of the flip-flop 73 is such as illustrated in FIG. 7E. This waveform is applied to the input of the Exclusive-OR which has other input supplied with the signal of the waveform shown in FIG. 7D. Consequently, the detection signal outputted by the Exclusive-OR 74 is of such a waveform as shown in FIG. 7F, in which pulses P2 and Q2 correspond to those P1 and Q1 shown in FIG. 7A, respectively.

Next, operation of the circuit shown in FIG. 2 will be described by referring to the timing diagrams illustrated in FIGS. 8A to 8H which are depicted on the assumption that the memory 12 shown in FIG. 2 produces the trigger signal 10 when the conditioning signal 6A or 6B is logic "1".

More specifically, FIG. 8A illustrates a waveform of the clock signal 3A inputted to the clock detection circuit 7A. This waveform includes pulses S1 and T1. On the other hand, the clock signal 3B applied to the clock detection circuit 7B is of such a waveform as shown in FIG. 8B, and has pulse U1 and V1. FIG. 8C illustrates the waveform of the internal clock signal 4 applied to the inputs of the condition decision circuits 5A and 5B and the clock detection circuits 7A and 7B, respectively. FIG. 8D illustrates the waveform of the conditioning signal 6A shown in FIG. 2. A pulse S2 of this waveform (FIG. 8D) indicates that the data 2A (see FIG. 2) corresponding to S1 shown in FIG. 8A meets the trigger condition. On the other hand, it is indicated that the trigger condition is not met by the pulse T1 shown FIG. 8A. FIG. 8E shows the waveform of the detection signal 8A shown in FIG. 2 in which pulses S3 and T3 correspond to the pulses S1 and T1 shown in FIG. 8A. FIG. 8F illustrates an example of the waveform of the conditioning signal 6B shown in FIG. 2. Obviously, this signal meets the trigger condition, as will be seen from the waveform thereof. FIG. 8G shows a waveform of the detection signal 8B shown in FIG. 2 in which a pulse U3 is produced by the clock detection circuit 7B shown in FIG. 2 in response to the pulse U1 shown in FIG. 8B. The pulse V3 illustrated in FIG. 8G is produced in response to the detection of the pulse V1 shown in FIG. 8B. Since the waveforms shown in FIGS. 8D to 8G are applied to the control circuit 11, the trigger signal 10 is of such a waveform as shown in FIG. 8H. The pulses S4 and V4 appearing in the waveform shown in FIG. 8H are the trigger signal 10 which correspond, respectively, to the pulse S1 shown in FIG. 8A to the pulse V1 shown in FIG. 8B.

As will be appreciated from the foregoing description, the present invention brings about the advantages mentioned below:

(a) Operation of the multi-CPU system can be effectively traced by virtue of the possibility of triggering tracing operations for the individual CPUs in complicated combinations.

(b) Because tracing operation of one sampling channel can be controlled by the condition of the other sampling channel, an extremely high freedon can be attained in the tracing operation.

It is thought that the present invention and many of its attendant advantages will be understood from the foregoing description and it will be apparent that various changes may be made in the from, construction and arrangement of the parts described herein without departing from the spirit and scope of the invention or sacrificing all of its material advantages, the from hereinbefore described being merely a preferred or exemplary embodiment thereof.

We claim:

1. A logic analyzer including at least a sampling system for sampling input data with a sampling clock signal, comprising:
    a condition decision circuit having inputs supplied with said input data and an internal clock signal for producing a conditioning signal in dependence on said input data in synchronism with said internal clock signal;
    a clock detection circuit for deciding whether said sampling clock signal makes appearance within a predetermined period of said internal clock signal to produce a signal representative of the result of said decision; and
    a control circuit having inputs supplied with said conditioning signal and said signal representative of said result for producing a trigger signal corresponding to said conditioning signal in dependence on said signal representative of said result of decision.

2. A logic analyzer according to claim 1, wherein a number of said condition decision circuits are provided in combination with a corresponding number of said clock detection circuits, outputs of said condition decision circuits and said clock detection circuits being operatively connected to said control circuit.

* * * * *